(12) United States Patent
Onodera (10) Patent No.: US 7,292,086 B2
(45) Date of Patent: Nov. 6, 2007

(54) DELAY CIRCUIT AND SEMICONDUCTOR DEVICE

(75) Inventor: Tadashi Onodera, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 39 days.

(21) Appl. No.: 11/318,526

(22) Filed: Dec. 28, 2005

(65) Prior Publication Data

US 2006/0139079 A1   Jun. 29, 2006

(30) Foreign Application Priority Data

Dec. 28, 2004   (JP)   ............... 2004-380837

(51) Int. Cl.
   *H03H 11/26*   (2006.01)
(52) U.S. Cl. ............... 327/269; 327/261; 327/271
(58) Field of Classification Search ............... 327/261, 327/263, 268–272, 276, 284, 285, 239
   See application file for complete search history.

(56) References Cited

U.S. PATENT DOCUMENTS 5,670,904 A  *  9/1997  Moloney et al. ............ 327/277
6,366,149 B1 *  4/2002  Lee et al. ............... 327/276
6,958,641 B2 * 10/2005  Lee ....................... 327/261
6,989,703 B2 *  1/2006  Kang ...................... 327/261

FOREIGN PATENT DOCUMENTS

JP   63-174724   11/1988
JP   10-032473    2/1998

* cited by examiner

*Primary Examiner*—Linh My Nguyen
*Assistant Examiner*—Patrick O'Neill
(74) *Attorney, Agent, or Firm*—McDermott Will & Emery LLP (57) ABSTRACT

A delay circuit comprises: N-stage circuits having a first circit to a N-th circuit connected in cascade, the input signal being input to the first circuit and a transmission signal delayed by a (k-1)-stage (where $2 \leq k \leq N$) circuit is input to a k-th circuit for sequential transmission; a common delay circuit for delaying the transmission signal of each stage commonly; and path control means for controlling a path of an i-th ($1 \leq i \leq N$) circuit so that during a predetermined period from an edge timing of a signal input to the i-th circuit to an edge timing of the transmission signal delayed by the common delay circuit through the i-th circuit, the common delay circuit is connected to a signal path, and during the other period, the common delay circuit is disconnected from the signal path, wherein the delayed signal passing through the common delay circuit N times is generated.

9 Claims, 9 Drawing Sheets

CONDITIONS OF SWITCHING CONTROL
OF TRI-STATE INVERTER 51

| PERIOD (TIMING) | t0~t1 | t1~t2 | t2~t6 |
|---|---|---|---|
| INPUT SIGNAL (Sin) | L | H | H |
| DELAYED SIGNAL (D1) | L | L | H |
| ENABLE SIGNAL (EN1) | H | L | H |
| PMOS TRANSISTOR 111 | OFF | ON | OFF |
| NMOS TRANSISTOR 114 | OFF | ON | OFF |
| STATE OF TRI-STATE INVERTER | HIGH-IMPEDANCE STATE | INVERTER OPERATION | HIGH-IMPEDANCE STATE |

FIG.9

DELAY CIRCUIT AND SEMICONDUCTOR DEVICE

BACKGROUND OF THE INVENTION

1. Field of the Invention

The present invention relates to a delay circuit which delays a signal for use in digital control or the like by a desired delay time and outputs it.

2. Related Art

In general, a delay circuit for supplying a control signal having a specified pattern at different timings is used in a semiconductor device (e.g., refer to Japanese Patent Application Publication No. 10-32473 or Microfilm of Japanese Utility Model Application No. 61-178214 (Japanese Utility Model Application Publication No. 63-174724)). In a configuration of such a delay circuit in the semiconductor device, a signal is input to series-connected inverters, and delays of the respective inverters depending on time constant thereof are accumulated to obtain a desired delay time.

A long delay time is often required for the delay circuit in the semiconductor device. A first method for obtaining the long delay time is to configure the delay circuit using a large number of inverters. A second method for obtaining the long delay time is to increase the time constant of each inverter in the delay circuit. The second method can be realized, for example, by reducing the size of the inverters to reduce current supply ability, and by providing a capacitor connected to the output-side in order to prolong the charge/discharge time.

Further, in addition to the long delay time, a plurality of delayed signals which are delayed sequentially at constant intervals is used in operation in a form of using the delay circuit. By using such a delay circuit, many control signals having slightly shifted timings can be supplied when controlling many elements to be controlled sequentially, and thereby facilitating control thereof.

However, when obtaining the long delay time using the delay circuit by the above-mentioned first method, the longer the delay time is, the more the number of connections of the inverters. Thereby, an increase in layout area of the semiconductor device is inevitable, and there is a fear of an increase in chip size or cost increase. On the other hand, by the above-mentioned second method, the inverters have to be formed small enough to obtain large time constant, and thus the delay circuit may be affected by manufacturing process or fluctuation of power supply. As a result, it is a problem that accuracy of the delay time of the delay circuit is deteriorated. Further, even if the long delay time is obtained in the entire delay circuit, it is difficult to realize a configuration in which a plurality of delayed signals having different timings at constant intervals is generated and used for control.

SUMMARY OF THE INVENTION

It is an object of the present invention to provide a delay circuit which can generate a long delay time with high accuracy without an increase in layout area and further easily generate many delayed signals having different timings at constant intervals An aspect of the present invention is a delay circuit for delaying an input signal with an edge at a predetermined timing and outputting a delayed signal, comprising: N-stage circuits (where N is an integer greater than, or equal to, 2) having a first circuit to an N-th circuit connected in cascade, said input signal being input to said first circuit and a transmission signal delayed by a (k-1)-stage (where $2 \leq k \leq N$) circuit is input to a k-th circuit for sequential transmission; a common delay circuit for delaying said transmission signal of each stage of said N-stage circuits commonly; and path control means for controlling a path of an i-th ($1 \leq i \leq N$) circuit of said N-stage circuits so that during a predetermined period from an edge timing of a signal input to said i-th circuit to an edge timing of said transmission signal delayed by said common delay circuit through said i-th circuit, said common delay circuit is connected to a signal path, and during the other period, said common delay circuit is disconnected from said signal path, wherein said delayed signal passing through said common delay circuit N times in the path of said N-stage circuits is generated.

According to the aspect of the invention, for example, when delaying signal having a level changing at a predetermined timing, the signal is transmitted sequentially as an input signal from the first circuit to the N-th circuit and pass through the common delay circuit N times according to switching control of each stage, and delay times are accumulated to generate a delayed signal having a long delay time. At this time, switching of each stage is controlled so that the common delay circuit is connected to the signal path based on transmission signals of one stage and the preceding stage only during the period between both edge timings thereof. Thereby, transmission signals which do not overlap between different stages and are adjacent to each other in time. Accordingly, by increasing the number of stages, a long delay time can be obtained without increasing a unit delay time of the common delay circuit. And particularly in a case in which the delay circuit is implemented in the semiconductor device, an increase in layout area is not required. Further, since a large time constant of each inverter used in the delay circuit is not required, a stable delay time is obtained with high accuracy In the present invention, said transmission signal of each stage of said N-stage circuits may be delayed by a unit delay time $\Delta t$, and each said i-th circuit may output a delayed signal having an accumulated delay time $i\Delta t$.

In the present invention, each stage of said N-stage circuits may include an input-side circuit which connects an input-side signal path to an input of said common delay circuit and an output-side circuit which connects an output of said common delay circuit to an output-side signal path, and said path control means may include switching means for switching the connection of both said input-side and output-side circuits of each stage of said N-stage circuits between on and off.

In the present invention, said switching means may comprise a tri-state inverter capable of switching between an inverter operation and a high-impedance state in response to an enable signal, said enable signal may be commonly applied to each tri-state inverter of both said input-side and output-side circuits of each stage of said N-stage circuits, and switching may be controlled so that said tri-state inverter is in said inverter operation during said predetermined period and said tri-state inverter is in said high-impedance state during the other period.

In the present invention, in said N-stage circuit, each said transmission signal of odd number stage circuits may be logically inverted to each said transmission signal of even number stage circuits.

In the present invention, said switching means may supply a reset signal for initializing switching operation to said N-stage circuits and said common delay circuit, and after an edge timing of said input signal and all edge timings of N delayed signals extracted from the stages of said N-stage circuits are elapsed, said reset signal may be controlled to be supplied for initializing.

In the present invention, said reset signal may be generated based on said input signal of the first stage circuit.

An aspect of the present invention is a semiconductor device comprising a circuit including the above-mentioned delay circuit.

In the semiconductor device of the present invention, N delayed signals extracted from the stages of said N-stage circuits may be used as control signals for use in refresh operation of a semiconductor memory.

As described above, according to the present invention, a transmission signal passes through one common delay circuit repeatedly using the N-stage circuits connected in cascade, and thus a delayed signal having accumulated delay time can be generated.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

An embodiment of the present invention will be described below with reference to accompanying drawings. In this embodiment, the present invention is applied to a delay circuit which is a circuit element in a semiconductor device or the like.

Figure 1:
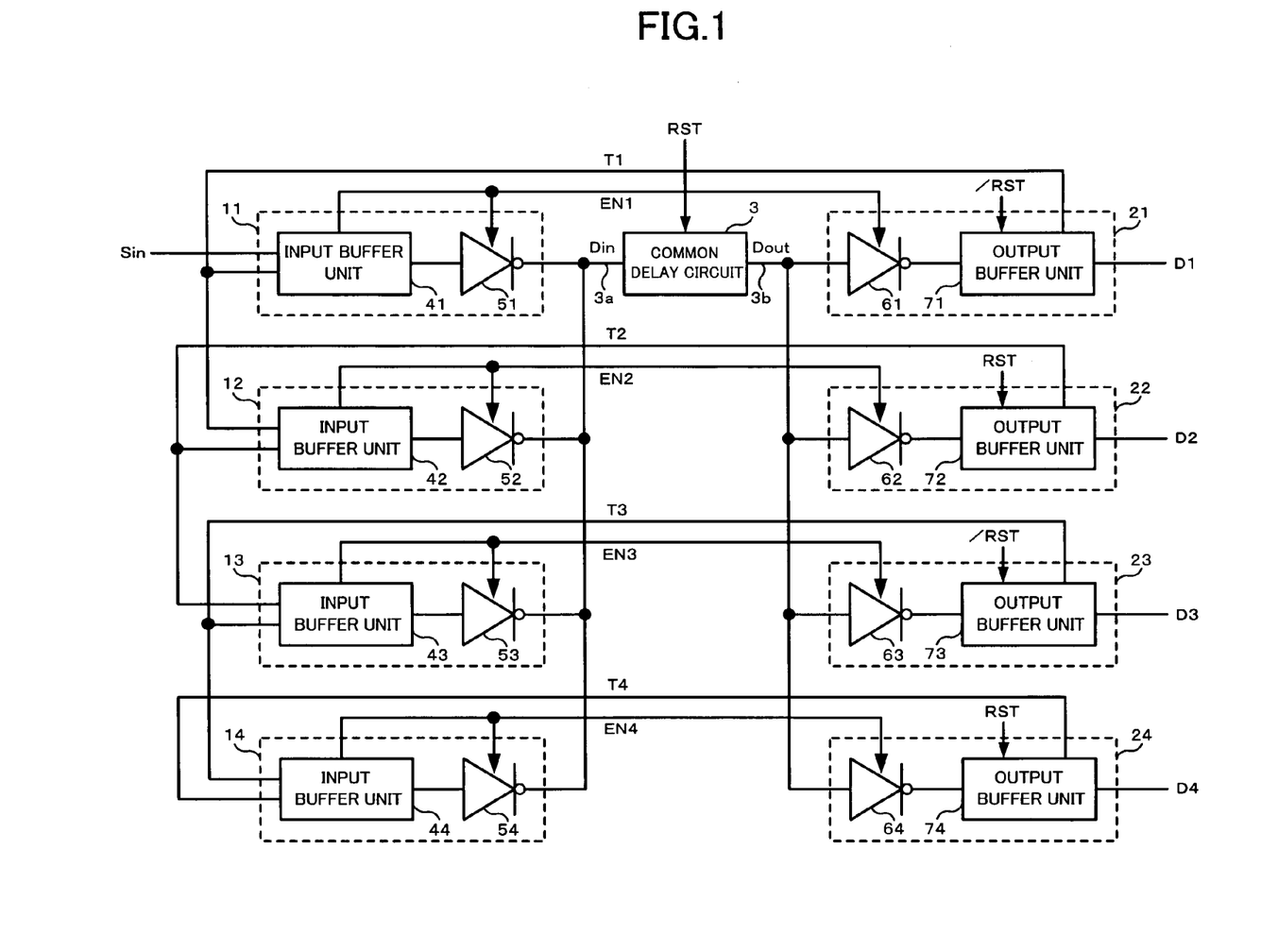
FIG. 1 is a functional block diagram of a delay circuit of an embodiment of the present invention.
Figure 2:
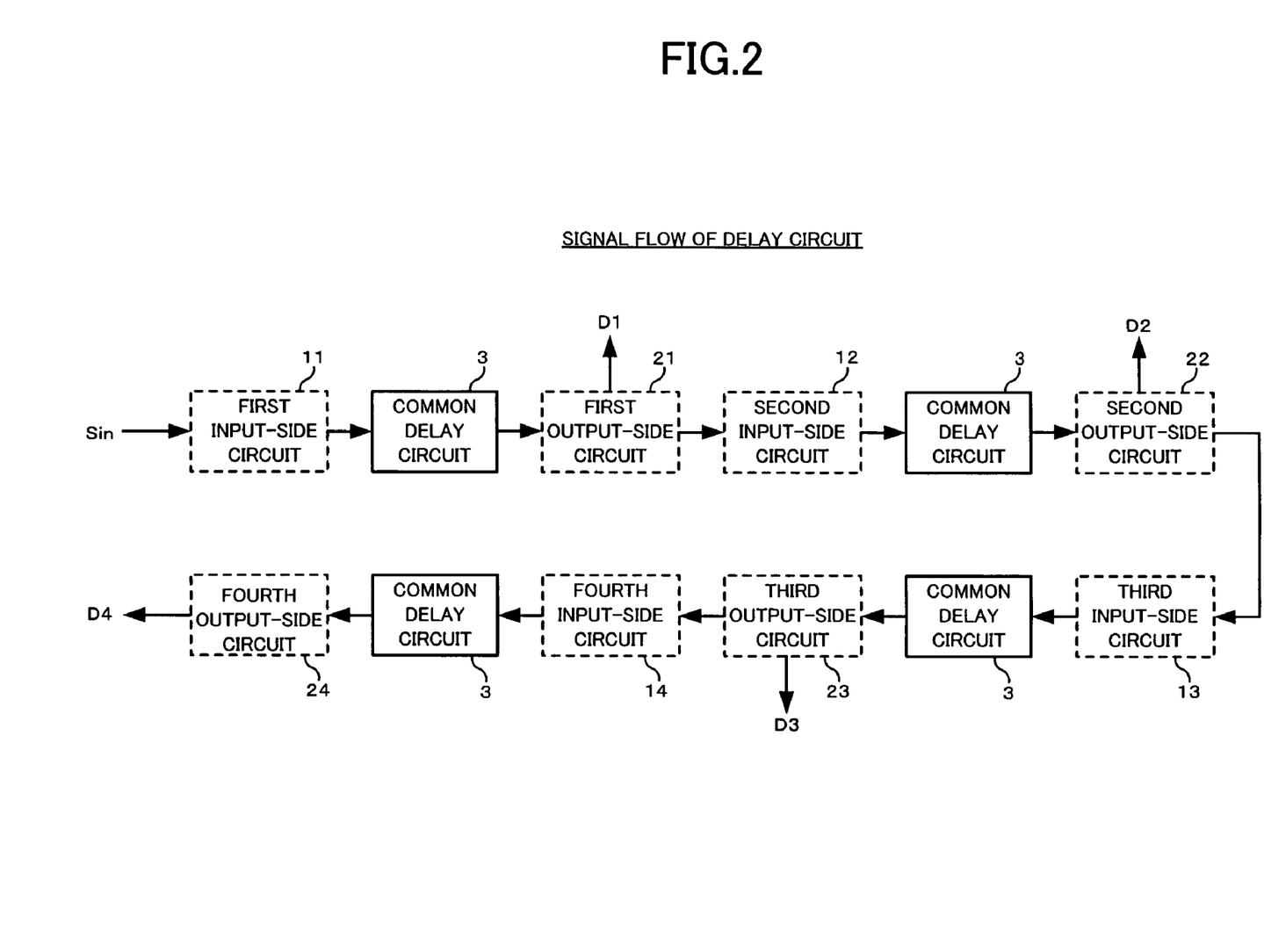
FIG. 2 is a diagram explaining a signal flow from an input signal Sin to a last delayed signal D4 in the delay circuit in FIG. 1.

First, the basic configuration and function of the delay circuit of this embodiment are described using FIGS. 1 and 2. FIG. 1 is a functional block diagram of the delay circuit of this embodiment. The delay circuit shown in FIG. 1 comprises four-stage circuits connected in cascade which includes four input-side circuits 11, 12, 13 and 14, four output-side circuits 21, 22, 23 and 24 and one common delay circuit 3. The four-stage circuits in FIG. 1 are divided into a first circuit composed of a first input-side circuit 11 and a first output-side circuit 21, a second circuit composed of a second input-side circuit 12 and a second output-side circuit 22, a third circuit composed of a third input-side circuit 13 and a third output-side circuit 23, and a fourth circuit composed of a fourth input-side circuit 14 and a fourth output-side circuit 24. The common delay circuit 3 is connected commonly in respective signal paths of the first to fourth circuits. The common circuit 3 delays an input signal Din by a predetermined time and outputs the delayed signal as a signal Dout.

The first input-side circuit 11 includes an input buffer unit 41 to which an input signal Sin is input from the outside and a tri-state inverter 51 as switching means connected to the input buffer unit 41. In the input buffer unit 41, an enable signal EN1 for path control is generated based on the input signal Sin. The tri-state inverter 51 is connected to the input terminal 3a of the common delay circuit 3 and switching of the tri-state inverter 51 is controlled between connecting state (inverter operation) and disconnecting state (high-impedance state) in response to the enable signal EN1.

The first output-side circuit 21 includes a tri-state inverter 61 as switching means connected to the output terminal 3b of the common delay circuit 3 and an output buffer unit 71 connected to the tri-state inverter 61. Switching of the tri-state inverter 61 is controlled between connecting state and disconnecting state in response to the enable signal EN1 in association with the tri-state inverter 51 of the input-side. A delayed signal D1 is output to the outside from the output buffer unit 71. Further, a transmission signal T1 having the same polarity as the delayed signal D1 is output from the output buffer unit 71, fed back to the input buffer unit 41, and transmitted to the input buffer unit 42 of the subsequent second input-side circuit 12.

The second to fourth input-side circuits 12 to 14 include input buffer units 42 to 44 and tri-state inverters 52 to 54 similarly to the above-mentioned first input-side circuit 11, and the second to fourth output-side circuits 22 to 24 include tri-state inverters 62 to 64 and output buffer units 72 to 74 similarly to the above-mentioned first output-side circuit 21. The input-side tri-state inverters 52 to 54 are connected to the input terminal 3a of the common delay circuit 3, and the output-side tri-state inverters 62 to 64 are connected to the output terminal 3b of the common delay circuit 3. Switching of respective output paths of the tri-state inverters 52 to 54 and respective input paths of the tri-state inverters 62 to 64 are controlled in response to common enable signals EN2 to EN4.

In the second output-side circuit 22, a delayed signal D2 is output to the outside from the output buffer unit 72, and a transmission signal T2 having the opposite polarity of the delayed signal D2 is output from the output buffer unit 72 to be fed back to the input buffer unit 42, which is transmitted to the input buffer unit 43 of the subsequent third input-side circuit 13. Similarly, in the third output-side circuit 23, a delayed signal D3 is output to the outside from the output buffer unit 73, and a transmission signal T3 having the same polarity as the delayed signal D3 is output from the output buffer unit 73 to be fed back to the input buffer unit 43, which is transmitted to the input buffer unit 44 of the subsequent fourth input-side circuit 14. Further, in the fourth output-side circuit 24, a delayed signal D4 is output to the outside from the output buffer unit 74, and a transmission signal T4 having the opposite polarity of the delayed signal D4 is output from the output buffer unit 74 to be fed back to the input buffer unit 44.

Here, FIG. 2 shows a diagram explaining a signal flow from the input signal Sin to the last delayed signal D4 in the delay circuit shown in FIG. 1. In FIG. 2, the input signal Sin passes through the path of the first stage in the first place to be transmitted through in the order of the first input-side circuit 11, the common delay circuit 3 and the first output-side circuit 21, and is delayed by a unit delay time Δt. The unit delay time Δt is an addition of the delay time of the common delay circuit 3 and a delay time in transmitting between adjacent stages, and corresponds to a delay time per stage in the delay circuit in FIG. 1.

Then, the transmitted signal passes through the path of the second stage to be transmitted through in the order of the second input-side circuit 12, the common delay circuit 3 and the second output-side circuit 22, and is delayed by an accumulated delay time 2Δt. Then, the transmitted signal passes through the path of the third stage to be transmitted through in the order of the third input-side circuit 13, the common delay circuit 3 and the third output-side circuit 23, and is delayed by an accumulated delay time 3Δt. Lastly, the transmitted signal passes through the path of the fourth stage to be transmitted through in the order of the fourth input-side circuit 14, the common delay circuit 3 and the fourth output-side circuit 24, and is delayed by an accumulated delay time 4Δt. At this time, switching of the connection between each stage path and the common delay circuit 3 should be adequately controlled according to the signal transmission timing, which will be described specifically later.

In addition, as shown in FIG. 2, the delayed signal D1 with the unit delay time Δt output from the first output-side circuit 21, the delayed signal D2 with the delay time 2Δt output from the second output-side circuit 22, the delayed signal D3 with the delay time 3Δt output from the third output-side circuit 23 and the delayed signal D4 with the delay time 4Δt output from the fourth output-side circuit 24 can be extracted separately.

Thus, in the delay circuit of this embodiment, since the input signal is controlled so as to pass through the common delay circuit 3 four times in one delay operation, the delay time 4Δt of four times the unit delay time Δt can be generated. Therefore, by the delay circuit of this embodiment, a long delay time can be easily obtained based on the input signal Sin with edges at predetermined timings. Further, by the delay circuit of this embodiment, a plurality of delayed signals having different edge timings at intervals of the unit delay time Δt can be generated and used, respectively.

In addition, although the four-stage delay circuit is explained in this embodiment, the present invention can be also applied to an N-stage delay circuit (where N is an integer greater than, or equal to, 2). By constructing the N-stage delay circuit in this embodiment, a delayed signal with a delay time NΔt of N times the unit delay time Δt which has passed through the common delay circuit 3 N times can be generated based on the input signal Sin, while a delay time iΔt can be generated from an i-th circuit and N signals having different edge timings at constant intervals can be extracted, respectively.

Figure 3:
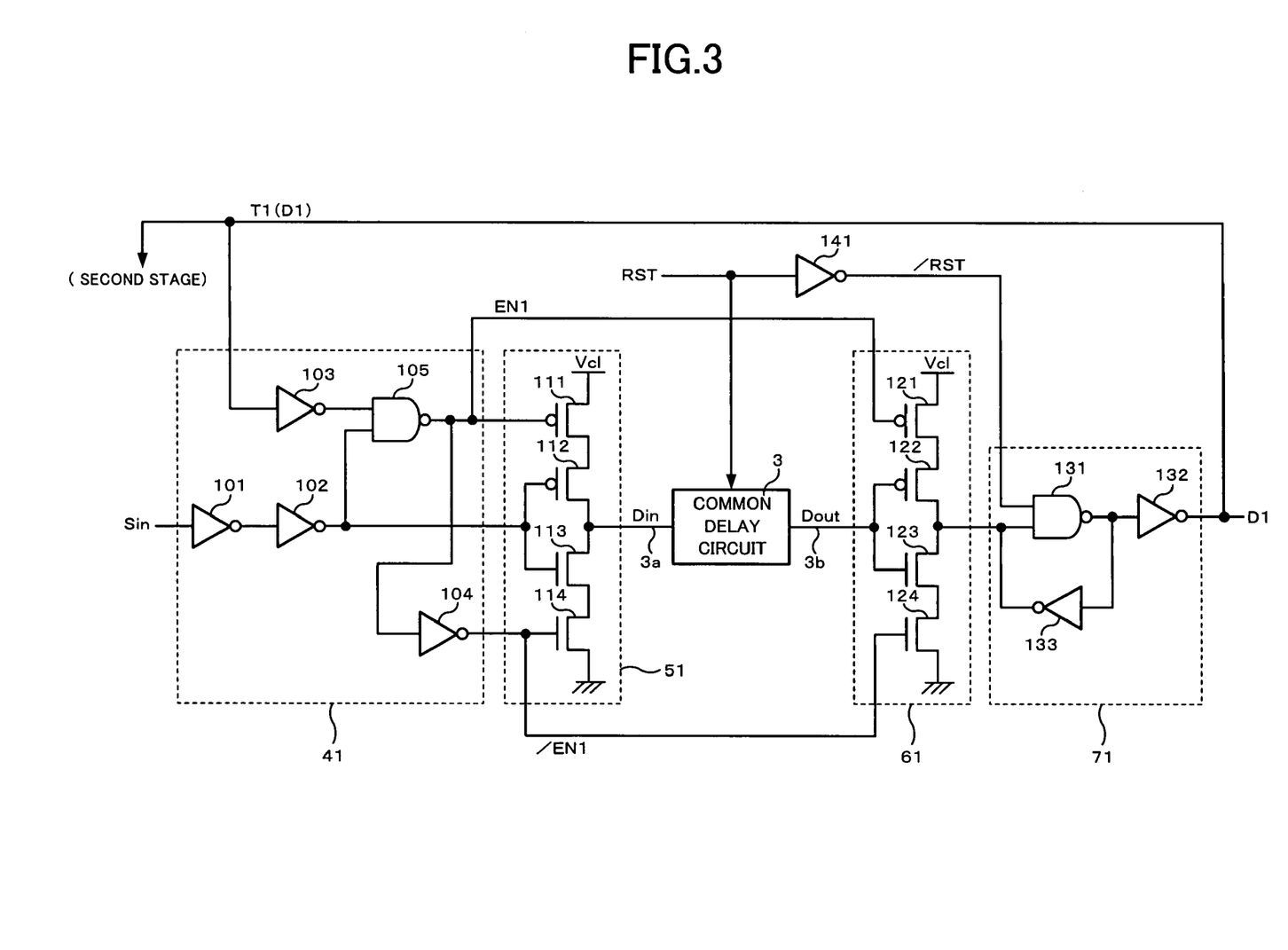
FIG. 3 is a diagram showing an example of a circuit configuration of a first circuit of the delay circuit of the embodiment.
Figure 8:
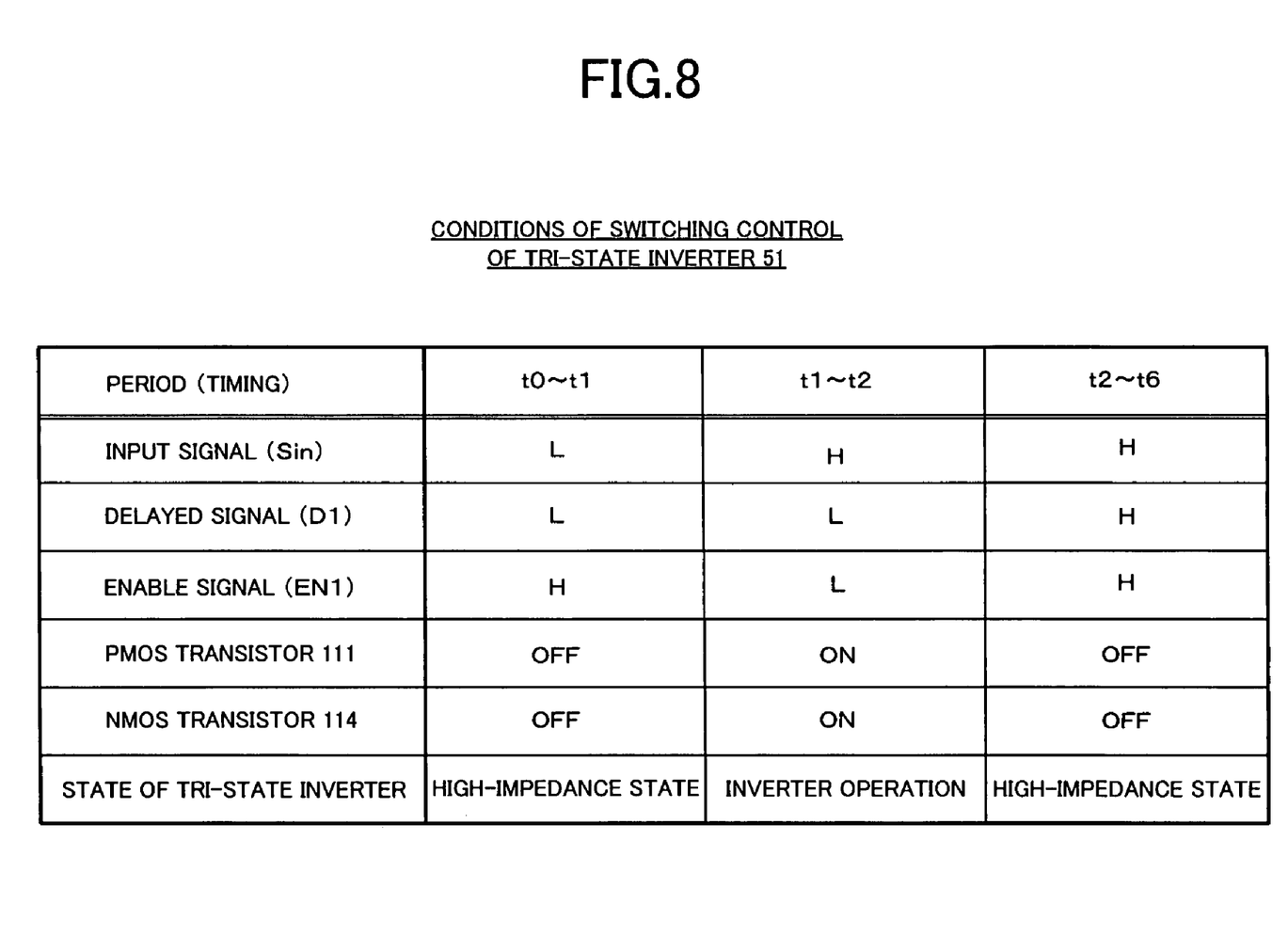
FIG. 8 is a diagram showing conditions of switching control of a tri-state inverter.
Figure 9:
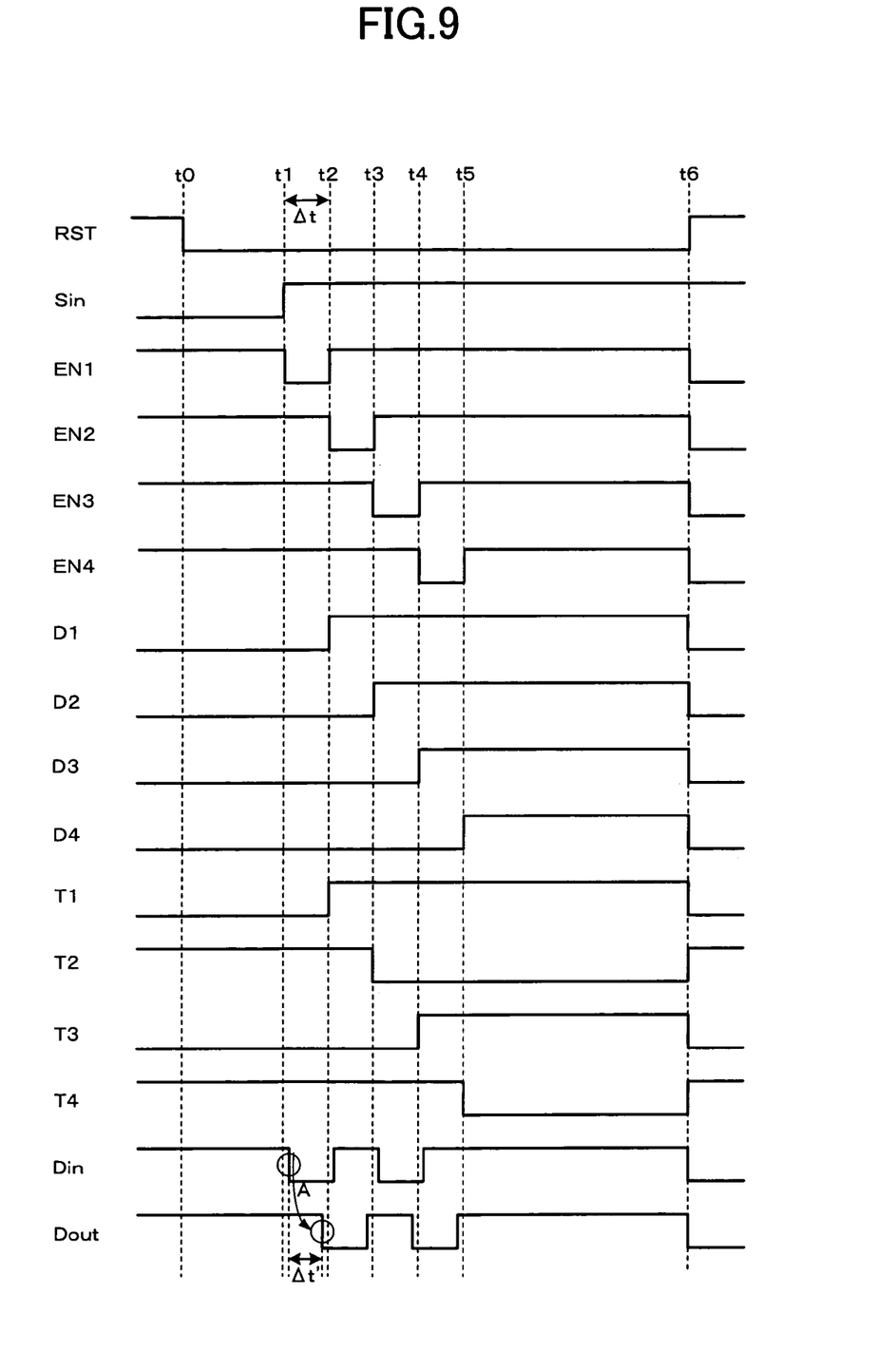
FIG. 9 is a diagram showing operation waveforms of the circuit configuration in FIGS. 3 to 7.

Next, specific circuit configuration and operation of the delay circuit of this embodiment will be described using FIGS. 3 to 9. An example of the circuit configurations into which the functional block diagram of FIG. 1 is subdivided is shown in FIGS. 3 to 7, conditions of switching control is shown in FIG. 8, and operation waveforms of the circuit configuration in FIGS. 3 to 7 are shown in FIG. 9. The first stage of the delay circuit, as shown in FIG. 3, comprises the input buffer unit 41 and the tri-state inverter 51 of the input-side, and the tri-state buffer 61 and the output buffer unit 71 of the output-side.

The input buffer unit 41 is composed of four inverters 101 to 104 and a NAND circuit 105. The input signal Sin from the outside passes through the inverters 101 and 102 in two stages for waveform shaping, and is input to one input terminal of the NAND circuit 105 and the tri-state inverter 51. As shown in FIG. 9, the input signal Sin rises at timing t1 from low to high. The timing t1 of the rising edge serves as a starting point of the delay time generated in the delay circuit of this embodiment. A reset signal RST supplied from the outside changes from high (initializing state) to low (operating state) at timing t0 preceding the rising edge of the input signal Sin. Further, as described below, an inverted signal of the input signal Sin can be used as the reset signal RST.

The transmission signal T1 is input through the inverter 103 to the other input terminal of the NAND circuit 105. The transmission signal T1 is the same as the delayed signal D1 output from the first stage and has a rising edge at timing t2 delayed by the unit delay time Δt from the timing t1, as shown in FIG. 9, according to later described operation. Therefore, the enable signal EN1 output from the NAND circuit 105 is low during the period in which the input signal Sin is high and the transmission signal T1 is low, and is high during the other period. That is, as shown in FIG. 9, the enable signal EN1 being low only during the period between timings t1 and t2 (time interval Δt) is obtained. And, an inverted enable signal/EN1 having the opposite polarity of the enable signal EN1 is output through the inverter 104.

The tri-state inverter 51 is composed of PMOS transistors 111 and 112 and NMOS transistors 113 and 114 series-connected between a power supply Vcl and ground. The enable signal EN1 is applied to the gate of the PMOS transistor 111 near the power supply Vcl, and the inverted enable signal/EN1 is applied to the gate of the NMOS transistor 114 near ground. The PMOS transistor 112 and the NMOS transistor 113 constitute an inverter, and the same signal as the input signal Sin is applied to each gate thereof.

Here, operation of the tri-state inverter 51 will be described using FIG. 8. On the premise of operation waveforms in FIG. 9, the enable signal EN1 is low only during the above described period between timings t1 and t2 according to a combination of the input signal Sin and the delayed signal D1. As shown in FIG. 8, when the enable signal EN1 is low, the PMOS transistor 111 near the power supply Vcl and the NMOS transistor 114 near ground are both on. Thereby, the PMOS transistor 112 and the NMOS transistor 113 work in normal inverter operation in which signal path is controlled in on state On the other hand, the enable signal EN1 is high during the period between t0 and t1 and between t2 and t6. When the enable signal EN1 is high, the PMOS transistor 111 near the power supply Vcl and the NMOS transistor 114 near ground are both off. Thereby, current paths of the PMOS transistor 112 and the NMOS transistor 113 are cut off to be in the high-impedance state at each drain output. In addition, the conditions of switching control as shown in FIG. 8 are common to all other tri-stage inverters except timing conditions.

By such operation, during the period in which the enable signal EN1 is low, the tri-state inverter 51 in the inverter operation is connected to the input terminal 3a of the common delay circuit 3 through the drains of the PMOS transistor 112 and the NMOS transistor 113. The signal Din input to the common delay circuit 3 is delayed by the predetermined time, and thereafter is transmitted as the signal Dout from the output terminal 3b to the output-side tri-state inverter 61. Meanwhile, during the period in which the enable signal EN1 is high, the connection between the tri-state inverter 51 in the high-impedance state and the common delay circuit 3 is disconnected. Specific circuit configuration of the common delay circuit 3 will be described later.

The output-side tri-state inverter 61 is composed of PMOS transistors 121 and 122 and NMOS transistors 123 and 124 series-connected between the power supply Vcl and ground, which has the same circuit configuration as that of the input-side tri-state inverter 51. Each gate of the PMOS transistors 122 and the NMOS transistors 123 which constitute an inverter is connected to the output terminal 3b of the common delay circuit 3. The enable signal EN1 is applied to the gate of the PMOS transistor 121 near the power supply Vcl, and the inverted enable signal/EN1 is applied to the gate of the NMOS transistor 124 near ground.

In this manner, the enable signal EN1 and the inverted enable signal/EN1 are input to the output-side tri-state inverter 61 in common with the input-side tri-state inverter 51. Thus, switching of the tri-state inverter 61 is controlled in association with switching of the tri-state inverter 51 so as to switch between the inverter operation and the high-impedance state at the same timing. Accordingly, during the period between timings t1 and t2 in which the enable signal EN1 is low as shown in FIG. 9, the signal path connecting the first input-side circuit 11, the common circuit 3 and the first output-side circuit 21 is formed, and during the other period, the signal path is disconnected.

The output buffer unit 71 is composed of a NAND circuit 131 and two inverters 132 and 133. The output signal of the tri-state inverter 61 is input to one input terminal of the NAND circuit 131, and an inverted reset signal/RST is input to the other input terminal thereof. The inverted reset signal/RST is output through an inverter 141 and has the opposite polarity of the reset signal RST. When the reset signal RST is high, the inverted reset signal/RST is low and the output of the NAND circuit 131 always maintains high. Meanwhile, when the reset signal RST is low, the inverted reset signal/RST is high and the output of the tri-state inverter 61 is inverted by the NAND circuit 131.

In the initializing state in which the reset signal RST is high, the output of the NAND circuit 131 is always high as described above, and the delayed signal D1 output from the output buffer unit 71 maintains low. Meanwhile, the tri-state inverter 61 shifts to the inverter operation at the timing t1 (in FIG. 9) at which the enable signal EN1 switches from high to low in a state that the reset signal RST is low. At this timing, the delayed signal D1 is low. Then, after the edge timing of the input signal Sin is delayed by the common delay circuit 3, the output of the tri-state inverter 61 is inverted from low to high, and the delayed signal D1 changes low to high at the timing t2 shown in FIG. 9. Consequently, the enable signal EN1 switches from low to high by operation of the input buffer unit 41, and the tri-state inverter 61 shifts to the high-impedance state. At this time, the connection of the NAND circuit 131 to the tri-state inverter 61 is disconnected, the output of the NAND circuit 131 is fed back through the inverter 133 to its input to enter latching state, and the operation state at this time is maintained.

By such operation, the delayed signal D1 with a rising edge delayed by the unit delay time Δt relative to the input signal Sin is obtained. And, the delayed signal D1 is input to the input buffer unit 41 as the transmission signal D1 as described above, and is transmitted to the subsequent second input-side circuit 12 to be used in the delay operation of the second stage.

Figure 4:
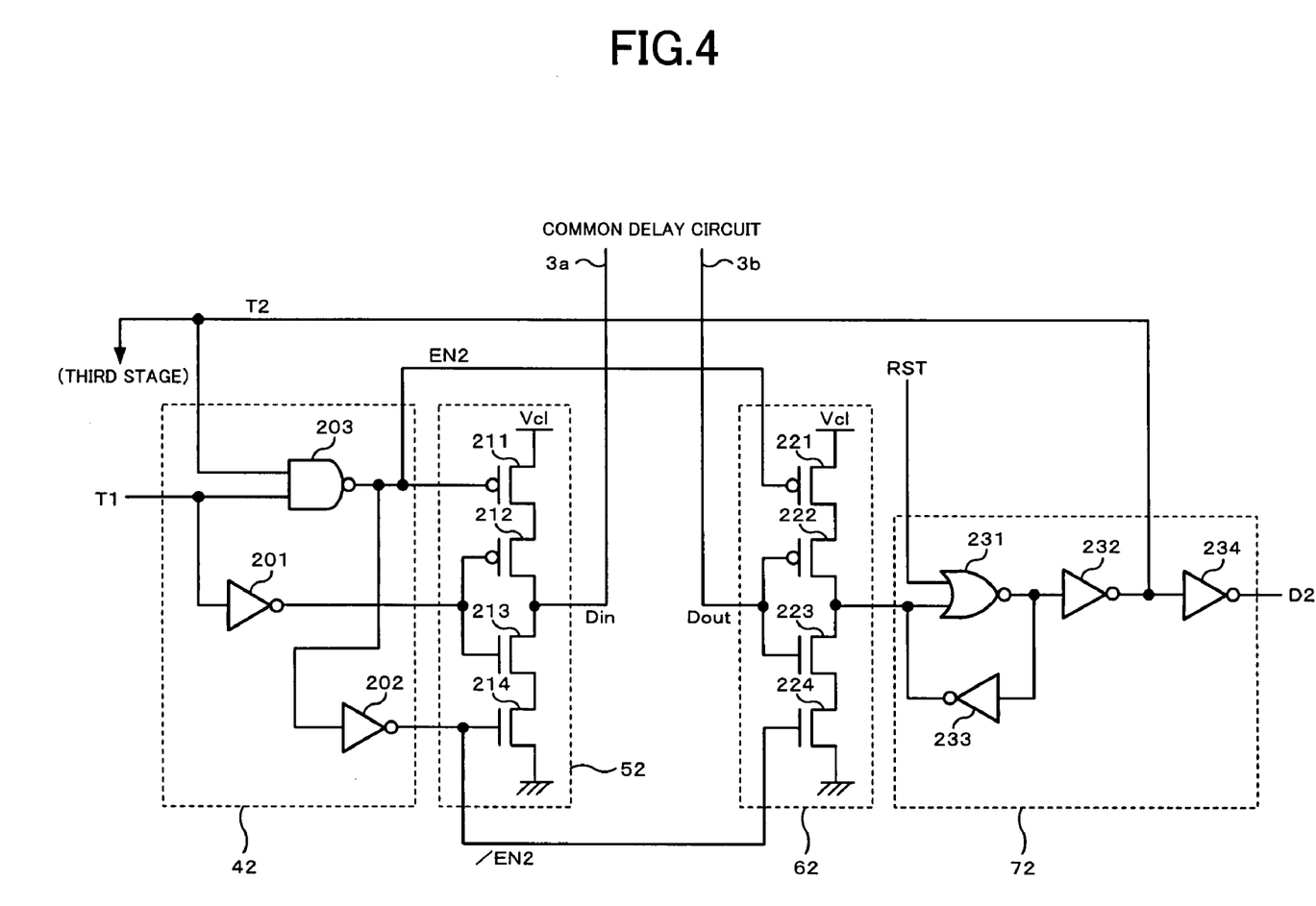
FIG. 4 is a diagram showing an example of a circuit configuration of a second circuit of the delay circuit of the embodiment.

Next, the second stage of the delay circuit, as shown in FIG. 4, comprises the input buffer unit 42 and the tri-state inverter 52 of the input-side, and the tri-state buffer 62 and the output buffer unit 72 of the output-side. In addition, in such a circuit configuration, regarding the circuit portion in which configuration and operation are the same as those of the first stage, only the outline will be explained omitting the detail thereof.

The input buffer unit 42 is composed of inverters 201 and 202 and a NAND circuit 203. The transmission signal T1 from the output buffer unit 71 of the first-stage is input to one input terminal of the NAND circuit 203 and is transmitted through the inverter 201 to the tri-state inverter 52. The transmission signal T2 as an output of the second stage is input to the other input terminal of the NAND circuit 203. The transmission signal T2 which is an inverted signal of the delayed signal D2 and has the opposite polarity thereof has a falling edge at timing t3 delayed by the delay time 2Δt from the timing t1 (in FIG. 9). Therefore, the output of the NAND circuit 203 is low during the period in which the transmission signal T1 and T2 are both high (the delayed signal D1 is high and the delayed signal D2 is low), and is high during the other period. Consequently, as shown in FIG. 9, the enable signal EN2 being low only during the period between timings t2 and t3 (time interval Δt) is obtained. And, an inverted enable signal/EN2 having the opposite polarity of the enable signal EN2 is output through the inverter 202.

The input-side tri-state inverter 52 is composed of PMOS transistors 211 and 212 and NMOS transistors 213 and 214. The output-side tri-state inverter 62 is composed of PMOS transistors 221 and 222 and NMOS transistors 223 and 224. Switching of the tri-state inverters 52 and 62 are both controlled in response to the enable signal EN2, and configuration and operation thereof are the same as those of the tri-state inverters 51 and 61 of the first stage. Thus, the tri-state inverters 52 and 62 are in the normal inverter operation when the enable signal EN2 is low, and are in the high-impedance state at each output when the enable signal EN2 is high.

In this case, as shown in FIG. 9, since the period during which the enable signal EN2 is low is between timings t2 and t3 and is delayed by the unit delay time Δt relative to timings t1 and t2, the common delay circuit 3 is controlled to be connected between the tri-state inverters 52 and 62 only during such a period. In other words, during the period between timings t2 and t3, the signal path connecting the second input-side circuit 12, the common circuit 3 and the second output-side circuit 22 is formed, and during the other period, the signal path is disconnected.

The output buffer unit 72 is composed of a NOR circuit 231 and three inverters 232, 233 and 234. The output signal of the tri-state inverter 62 is input to one input terminal of the NOR circuit 231, and the reset signal RST is input to the other input terminal thereof. When the reset signal RST is high, the output of the NOR circuit 231 always maintains low. Meanwhile, when the reset signal RST is low, the output signal of the tri-state inverter 62 is inverted by the NOR circuit 231 and is transmitted to the subsequent stage. In this manner, operation of the NOR circuit 231 is logically inverted to that of the NAND circuit 131 of the output buffer unit 71 of the first stage.

The transmission signal T1 which is logically inverted in a state in which the reset signal RST and the enable signal EN2 are both low is transmitted through the tri-state inverter 52, the common circuit 3 and the tri-state inverter 62 to the NOR circuit 231 and the inverters 232 and 233. Thus, the transmission signal T2 which switches from high to low at the timing t3 in association with the change of the output of the tri-state inverter 62 is generated. By such operation, the delayed signal D2 which has a rising edge delayed by the delay time 2Δt relative to the input signal Sin and has a falling edge delayed by the delay time Δt relative to the delayed signal D1 of the first stage is obtained. Meanwhile, the transmission signal T2 is input to the input buffer unit 42 and is transmitted to the subsequent third input-side circuit 13 to be used in the delay operation of the third stage.

Figure 5:
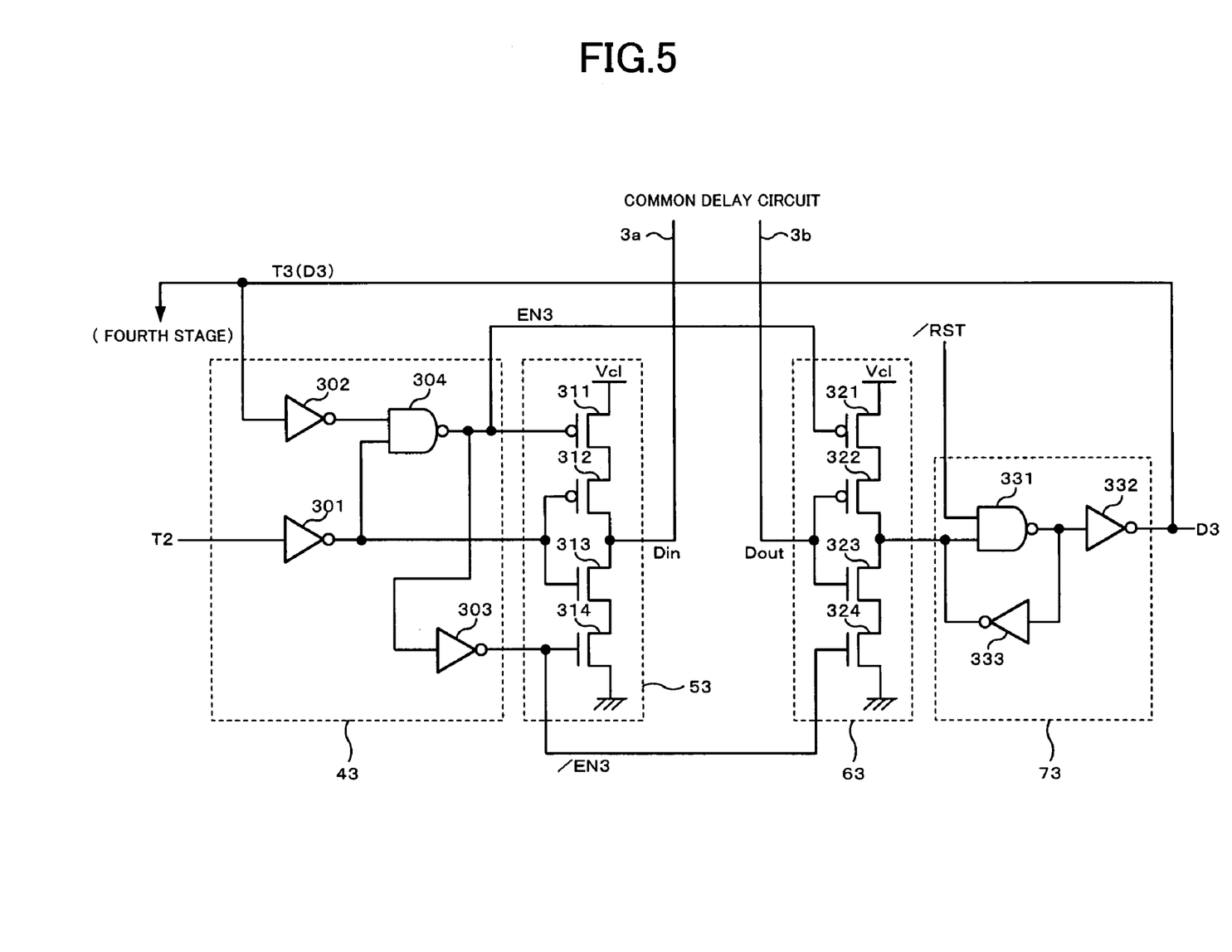
FIG. 5 is a diagram showing an example of a circuit configuration of a third circuit of the delay circuit of the embodiment.

Next, the third stage of the delay circuit, as shown in FIG. 5, comprises the input buffer unit 43 and the tri-state inverter 53 of the input-side, and the tri-state buffer 63 and the output buffer unit 73 of the output-side. In such a configuration, the input buffer unit 43 is composed of inverters 301 to 303 and a NAND circuit 304. A portion including the inverters 302 and 303 and the NAND circuit 304 has the same configuration as that of the inverter 103 and 104 and the NAND circuit 105 included in the input buffer unit 41 of the first stage. Meanwhile, the transmission signal T2 from the output buffer unit 72 of the second stage is logically inverted and thus is input to the tri-state inverter 53 after inversion by the inverter 301. In this case, as shown in FIG. 9, an enable signal EN3 being low only during the period between timings t3 and t4 (time interval Δt) is output from the NAND circuit 304, and further an inverted enable signal/EN3 having the opposite polarity of the enable signal EN3 is output through the inverter 303.

The input-side tri-state inverter 53 is composed of PMOS transistors 311 and 312 and NMOS transistors 313 and 314. The output-side tri-state inverter 63 is composed of PMOS transistors 321 and 322 and NMOS transistors 323 and 324. Switching of the tri-state inverters 53 and 63 are both controlled in response to the enable signal EN3 and configuration and operation thereof are the same as those of the tri-state inverters 51, 52, 61 and 62 of the first and second stages. Thus, the tri-state inverters 53 and 63 are in the normal inverter operation when the enable signal EN3 is low, and are in the high-impedance state at each output when the enable signal EN3 is high.

In this case, as shown in FIG. 9, since the period during which the enable signal EN3 is low is between timings t3 and t4 and is delayed by the delay time 2Δt relative to timings t1 and t2 of the enable signal EN1 of the first stage, the common delay circuit 3 is controlled to be connected between the tri-state inverters 53 and 63 only during such a period. In other words, during the period between timings t3 and t4, the signal path connecting the third input-side circuit 13, the common circuit 3 and the third output-side circuit 23 is formed, and during the other period, the signal path is disconnected.

The output buffer unit 73 is composed of a NAND circuit 331 and two inverters 332 and 334, similarly to the output buffer unit 71 of the first stage. Therefore, the delayed signal D3 with a rising edge delayed by the delay time 3Δt relative to the input signal Sin is obtained. The delayed signal D3 is input to the input buffer unit 43 as the transmission signal T3 and is transmitted to the subsequent fourth input-side circuit 14 to be used in the delay operation of the fourth stage.

Figure 6:
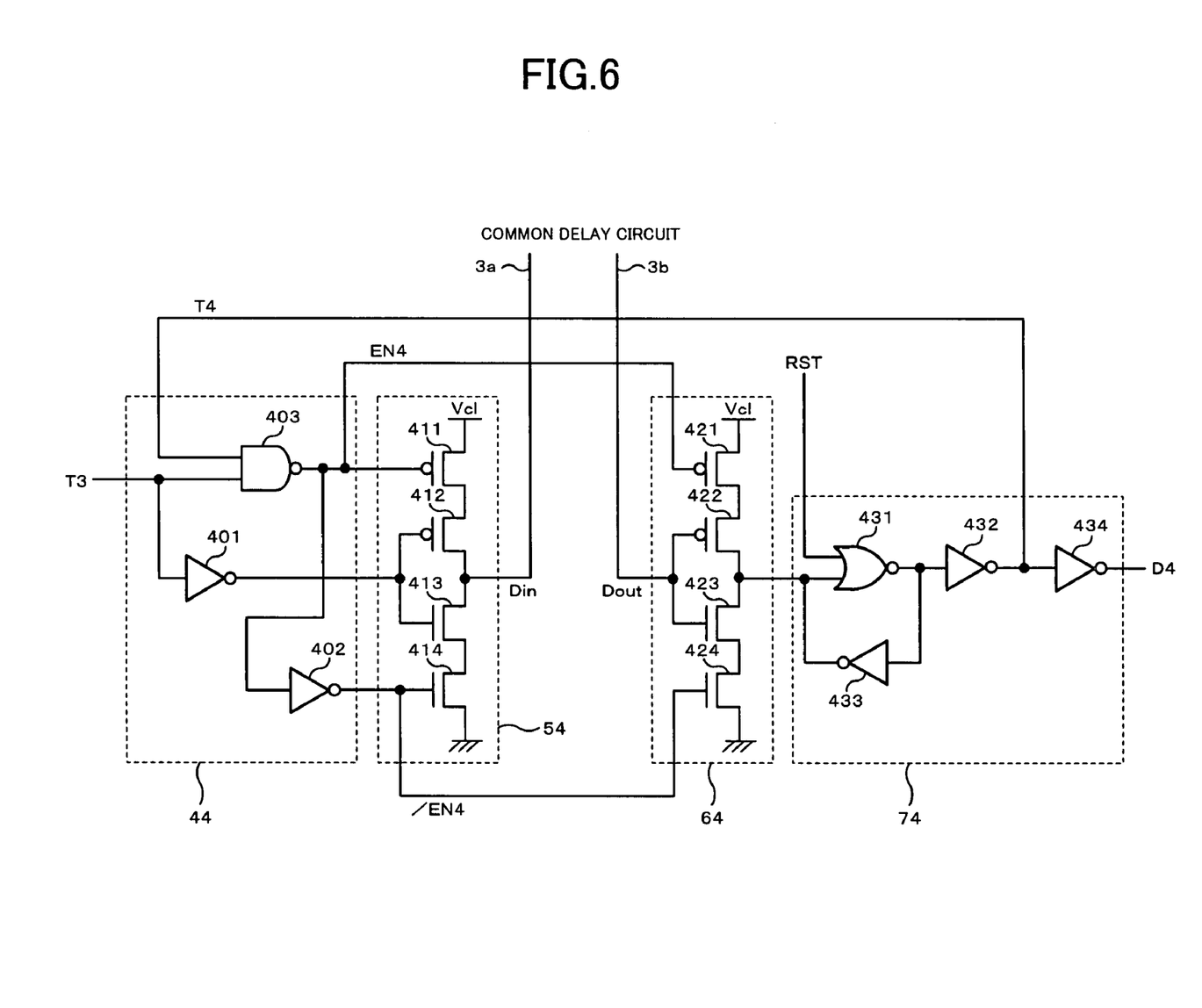
FIG. 6 is a diagram showing an example of a circuit configuration of a fourth circuit of the delay circuit of the embodiment.

Next, the fourth stage of the delay circuit, as shown in FIG. 6, comprises the input buffer unit 44 and the tri-state inverter 54 of the input-side, and the tri-state buffer 64 and the output buffer unit 74 of the output-side. In such a configuration, the input buffer unit 44 is composed of inverters 401 and 402 and a NAND circuit 403 and has the same configuration as that of the input buffer unit 42 of the second stage. In this case, as shown in FIG. 9, an enable signal EN4 being low only during the period between timings t4 and t5 (time interval Δt) is output from the NAND circuit 403, and further an inverted enable signal/EN4 having the opposite polarity of the enable signal EN4 is output through the inverter 402.

The input-side tri-state inverter 54 is composed of PMOS transistors 411 and 412 and NMOS transistors 413 and 414. The output-side tri-state inverter 64 is composed of PMOS transistors 421 and 422 and NMOS transistors 423 and 424. Switching of the tri-state inverters 54 and 64 are both controlled in response to the enable signal EN4 and configuration and operation thereof are the same as those of the tri-state inverters 51 to 53 and 61 to 63 of the first to third stages. Thus, the tri-state inverters 54 and 64 are in the normal inverter operation when the enable signal EN4 is low, and are in the high-impedance state at each output when the enable signal EN4 is high.

In this case, as shown in FIG. 9, since the period during which the enable signal EN4 is low is between timings t4 and t5 and is delayed by the delay time 3Δt relative to timings t1 and t2 of the enable signal EN1 of the first stage, the common delay circuit 3 is controlled to be connected between the tri-state inverters 54 and 64 only during such a period. In other words, during the period between timings t4 and t5, the signal path connecting the fourth input-side circuit 14, the common circuit 3 and the fourth output-side circuit 24 is formed, and during the other period, the signal path is disconnected.

The output buffer unit 74 is composed of a NOR circuit 431 and three inverters 432 to 434, similarly to the output buffer unit 72 of the second stage. Therefore, the delayed signal D4 with a rising edge delayed by the delay time 4Δt relative to the input signal Sin is obtained. The delayed signal D4 corresponds to a final delayed signal through the signal path of the delay circuit of this embodiment. Then, the transmission signal T4 having the opposite polarity of the delayed signal D4 is input to the input buffer unit 44.

Figure 7:
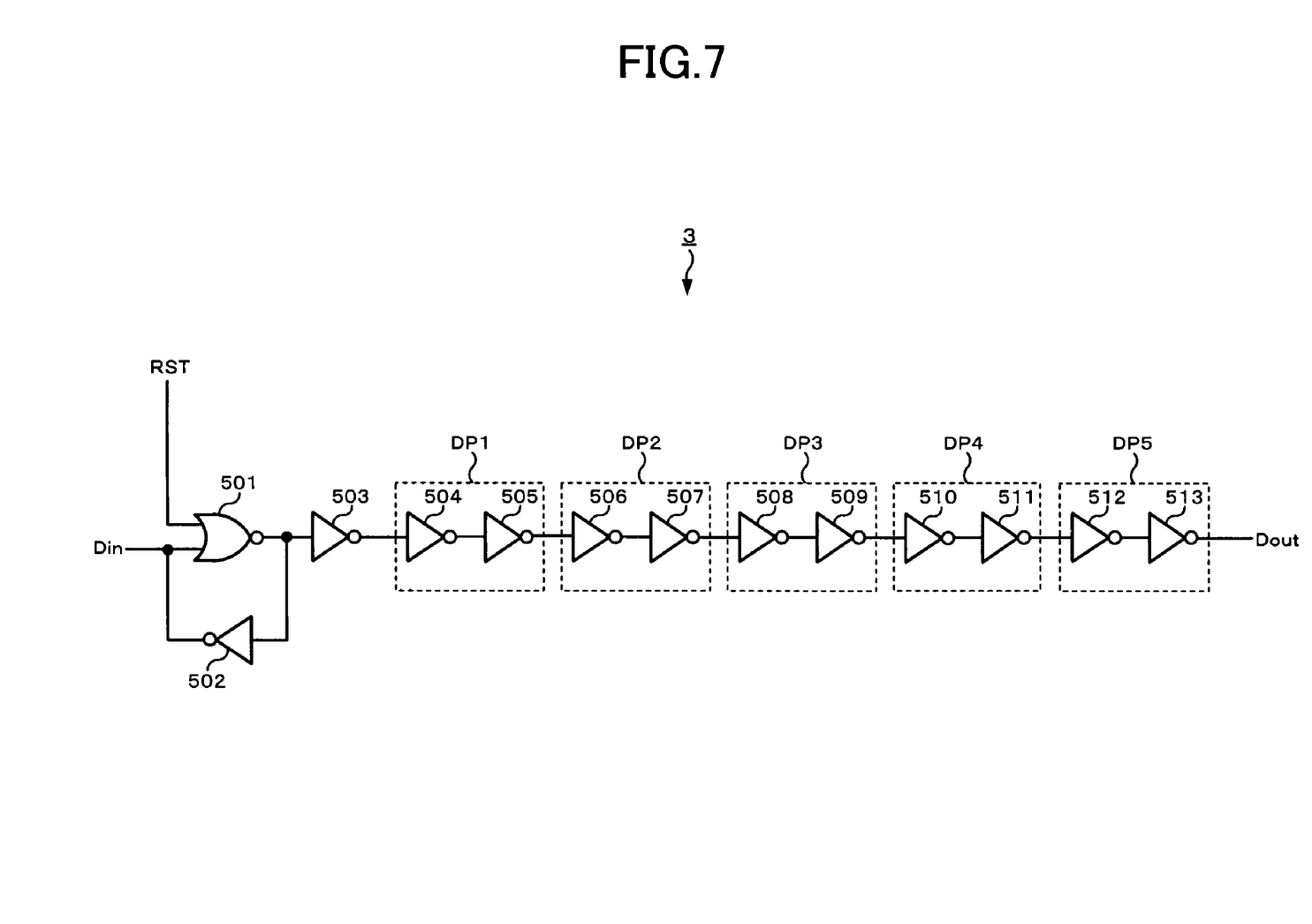
FIG. 7 is a diagram showing an example of a circuit configuration of a common delay circuit of the delay circuit of the embodiment.

Next, the common delay circuit 3 of the delay circuit can be implemented by a circuit configuration as shown in FIG. 7. The common delay circuit 3 in FIG. 7 includes a NOR circuit 501 and twelve inverters 502 to 513. The input signal Din and the reset signal RST are input to the NOR circuit 501. A circuit portion including the NOR circuit 501 and the inverters 502 and 503 of the input-side, for example, operates similarly to the circuit portion including the NOR circuit 231 and the inverters 232 and 233 of the output buffer unit 72 in FIG. 4. Thus, only when the reset signal RST is low, the input signal Din is inverted and transmitted to the subsequent circuit.

Ten inverters 504 to 513 constitute five unit delay circuits DP1 to DP5 each of which includes a pair of inverters. Size and characteristics of the inverters 504 to 513 are the same as each other, and time constant thereof is the same. The entire delay time Δt' is determined depending on the time constant of respective unit delay circuits DP1 to DP5. For example, if one delay time of each of the unit delay circuits DP1 to DP5 is set to 0.2 ns, the entire unit delay circuits DP1 to DP5 have the entire delay time Δt' of 1 ns.

Here, since not only the delay of each of the unit delay circuits DP1 to DP5, but also delays caused by wirings or the other circuits exist, the entire delay time Δt' is slightly smaller than the unit delay time Δt as a unit delay time per stage of the delay circuit. As shown in FIG. 9, a timing at which the output signal Dout changes is delayed by the delay time Δt' (shown as "A" in FIG. 9) relative to a timing at which the input signal Din in the common delay circuit 3, and is slightly shifted from common timings at which signals of each stage of the delay circuit changes.

In addition, the number of connection stages of the unit delay circuits of the common delay circuit 3 can be appropriately adjusted in accordance with the desired delay time Δt'. In this case, by providing a switch in the path through the unit delay circuits in order to change the number of the connection stages, the delay time Δt' is variably controlled by the switch.

As described above, by constructing the circuits of the first to fourth stages and the common delay circuit 3 so that the entire delay circuit operates integrally, the delayed signals with the delay times Δt, 2Δt, 3Δt and 4Δt relative to the input signal Sin are obtained, respectively. As shown in FIG. 9, since the enable signals EN1 to EN4 used for path control of each circuit are pulses which are adjacent to each other in time and do not overlap with each other, the common delay circuit 3 can be used repeatedly in different time zones. Accordingly, by increasing the number of stages of the delay circuit without increasing the delay time Δt' of the common delay circuit 3, a long delay time can be obtained.

Further, since the logic is inverted between odd number stages (first and third stages) and even number stages (second and fourth stages), the signals Din and Dout are inverted between adjacent stages. Therefore, switching is properly controlled so that mismatch does not occur at timings t2, t3 and t4 as time boundaries in transmitting the delayed signals D1 to D4. In this manner, the delayed signals D1 to D4 pass through the common delay circuit 3 four times in the paths of the first to fourth stages, and thus can be transmitted sequentially. Consequently, a stable long delay time can be obtained without an increase in layout area of the common delay circuit 3.

In addition, although in the above-described embodiment, the case in which the reset signal RST is supplied from the outside of the delay circuit is explained, the reset signal RST may be generated inside the delay circuit based on the input signal Sin. For example, in the first stage circuit, the output of the inverter 101 to which the input signal Sin is input may be used as the reset signal RST. In this case, the reset signal RST having the opposite polarity of the input signal Sin in FIG. 9 is obtained, the timings t0 and t1 are almost the same, and the delay circuit can be operated while the reset signal RST maintains low.

Semiconductor devices to which the delay circuit of this embodiment can be applied include a semiconductor memory, a logic LSI, an ASIC (Application Specific Integrated Circuit), a microprocessor, a DSP (Digital Signal Processor) or the like. Further, the delay circuit of this embodiment can be applied not only to semiconductor devices, but also to circuits constructed using general discrete components.

A useful application of this embodiment is a refresh control circuit of a DRAM. For example, in a DRAM divided into a plurality of memory areas, control is performed so that refresh control signals are supplied to respective memory areas at different timings in viewpoint of current concentration. By using the delay circuit of this embodiment to control such a way, the basic control signal is input to the first stage circuit, and thereby the delayed signals output from respective stages of the delay circuit are used as a plurality of control signals having different edge timings at constant intervals, which enable control of the respective memory areas.

Though the present invention has been concretely explained based on the embodiment, the present invention is not limited to the above-described embodiment, and various modifications may be possible without departing from the scope of the invention. For example, although the configuration for delaying the input signal with a rising edge at a predetermined timing is explained in this embodiment, in a case in which the input signal Sin has a falling edge at a predetermined timing, the present invention can be applied to a configuration in which an inverter of the input-side and an inverter of the output-side are provided or in which the entire circuit is configured in the opposite polarity.

Further, for example, although the tri-state inverters are used as switching means in this embodiment, other switching means which has a function to switch between on and off states in the signal path can also be used. For example, instead of the tri-state inverter 51 shown in FIG. 3, a circuit as follows can be used to realize the same function. That is, the circuit is configured such that the PMOS transistors 112 and the NMOS transistor 113 between the power supply Vcl and ground constitute an inverter, the input signal is applied to commonly connected gates thereof, between the output node of this inverter and the signal Din, a transfer gate composed of the PMOS transistor 111 and the NMOS transistor 114 is connected in parallel, the enable signal EN1 is applied to one gate thereof while the inverted enable signal/EN1 is applied to the other gate thereof. In the case in which such a circuit is used as the switching means, the same function as described in this embodiment can be realized.

The present invention is not limited to the above described embodiments, and various variations and modifications may be possible without departing from the scope of the present invention.

This application is based on the Japanese Patent application No. 2004-380837 filed on Dec. 28, 2004, entire content of which is expressly incorporated by reference herein.

What is claimed is:

1. A delay circuit for delaying an input signal with an edge at a predetermined timing and outputting a delayed signal, comprising:

N-stage circuits (where N is an integer greater than, or equal to, 2) having a first circuit to an N-th circuit connected in cascade, said input signal being input to said first circuit and a transmission signal delayed by a (k-1)-stage (where $2 \leq k \leq N$) circuit is input to a k-th circuit for sequential transmission;

a common delay circuit for delaying said transmission signal of each stage of said N-stage circuits commonly; and path control means for controlling a path of an i-th ($1 \leq i \leq N$) circuit of said N-stage circuits so that during a predetermined period from an edge timing of a signal input to said i-th circuit to an edge timing of said transmission signal delayed by said common delay circuit through said i-th circuit, said common delay circuit is connected to a signal path, and during the other period, said common delay circuit is disconnected from said signal path, wherein said delayed signal passing through said common delay circuit N times in the path of said N-stage circuits is generated.

2. A delay circuit according to claim 1, wherein said transmission signal of each stage of said N-stage circuits is delayed by a unit delay time Δt, and each said i-th circuit outputs a delayed signal having an accumulated delay time iΔt.

3. A delay circuit according to claim 1, wherein each stage of said N-stage circuits includes an input-side circuit which connects an input-side signal path to an input of said common delay circuit and an output-side circuit which connects an output of said common delay circuit to an output-side signal path, and wherein said path control means includes switching means for switching the connection of both said input-side and output-side circuits of each stage of said N-stage circuits between on and off.

4. A delay circuit according to claim 3, wherein said switching means comprises a tri-state inverter capable of switching between an inverter operation and a high-impedance state in response to an enable signal, said enable signal is commonly applied to each tri-state inverter of both said input-side and output-side circuits of each stage of said N-stage circuits, and switching is controlled so that said tri-state inverter is in said inverter operation during said predetermined period and said tri-state inverter is in said high-impedance state during the other period.

5. A delay circuit according to claim 1, wherein in said N-stage circuit, each said transmission signal of odd number stage circuits is logically inverted to each said transmission signal of even number stage circuits.

6. A delay circuit according to claim 1, wherein said switching means supplies a reset signal for initializing switching operation to said N-stage circuits and said common delay circuit, and wherein after an edge timing of said input signal and all edge timings of N delayed signals extracted from the stages of said N-stage circuits are elapsed, said reset signal is controlled to be supplied for initializing.

7. A delay circuit according to claim 6, wherein said reset signal is generated based on said input signal of the first stage circuit.

8. A semiconductor device comprising a circuit including the delay circuit of any of claims 1 to 7.

9. A semiconductor device according to claim 8, wherein N delayed signals extracted from the stages of said N-stage circuits are used as control signals for use in refresh operation of a semiconductor memory.

* * * * *